US011081881B2

(12) United States Patent
Agarwal et al.

(10) Patent No.: US 11,081,881 B2
(45) Date of Patent: Aug. 3, 2021

(54) FULL SWING POSITIVE TO NEGATIVE MOSFET SUPPLY CLAMP FOR ELECTROSTATIC DISCHARGE (ESD) PROTECTION

(71) Applicant: STMicroelectronics International N.V., Schiphol (NL)

(72) Inventors: Divya Agarwal, Noida (IN); Radhakrishnan Sithanandam, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 896 days.

(21) Appl. No.: 15/848,288

(22) Filed: Dec. 20, 2017

(65) Prior Publication Data

US 2019/0190256 A1  Jun. 20, 2019

(51) Int. Cl.
| H02H 9/04 | (2006.01) |
| H02H 1/00 | (2006.01) |
| H01L 27/02 | (2006.01) |
| H01L 27/092 | (2006.01) |
| H01L 27/06 | (2006.01) |
| H01L 23/528 | (2006.01) |

(52) U.S. Cl.
CPC ......... H02H 9/046 (2013.01); H01L 27/0266 (2013.01); H01L 27/0285 (2013.01); H02H 1/0007 (2013.01); H01L 23/528 (2013.01); H01L 27/0629 (2013.01); H01L 27/092 (2013.01)

(58) Field of Classification Search
CPC ............... H01L 23/528; H01L 27/0266; H01L 27/0285; H01L 27/0629; H01L 27/092; H02H 1/0007; H02H 9/046
See application file for complete search history.

(56) References Cited

U.S. PATENT DOCUMENTS

| 5,912,494 A * | 6/1999 | Yu ....................... H01L 27/0266 257/355 |
| 6,133,775 A * | 10/2000 | Schambacher ..... H01L 27/0629 257/E27.016 |
| 8,144,441 B2 * | 3/2012 | Ping .................... H01L 27/0266 361/56 |
| 9,214,806 B1 * | 12/2015 | Huang ................ H01L 27/0266 |
| 10,147,717 B2 * | 12/2018 | Altolaguirre .......... H02H 9/046 |
| 2013/0077195 A1 * | 3/2013 | Stockinger ............. H02H 9/046 361/56 |

FOREIGN PATENT DOCUMENTS

| CN | 103412216 A | 11/2013 |
| CN | 104638622 A | 5/2015 |
| CN | 105449654 A | 3/2016 |
| CN | 106505066 A | 3/2017 |

OTHER PUBLICATIONS

Fiest Office Action and Search Report and co-pending CN Appl. No. 201811401979.8 dated Oct. 29, 2020 (7 pages).

* cited by examiner

Primary Examiner — Jared Fureman
Assistant Examiner — Nicolas Bellido
(74) Attorney, Agent, or Firm — Crowe & Dunlevy

(57) ABSTRACT

Electrostatic discharge (ESD) protection is provided in using a supply clamp circuit including a trigger actuated MOSFET device. Triggering of the MOSFET device is made in response to detection of either a positive ESD event or a negative ESD event.

16 Claims, 5 Drawing Sheets

FULL SWING POSITIVE TO NEGATIVE MOSFET SUPPLY CLAMP FOR ELECTROSTATIC DISCHARGE (ESD) PROTECTION

TECHNICAL FIELD

The present invention relates to a device for protecting an integrated circuit against overvoltages and, in particular, against electrostatic discharges.

BACKGROUND

FIG. 1 shows a circuit diagram for a conventional supply clamp circuit 10p for electrostatic discharge (ESD) protection with respect to a positive voltage supply range. The supply clamp circuit 10p is formed by a switching circuit 12p coupled between a positive supply voltage line 14p (POS_VDD) of the integrated circuit and a ground supply voltage line 16 (GND) of the integrated circuit. The positive supply voltage line 14p is coupled to a positive power supply pad 22p for the integrated circuit and the ground supply voltage line 16 is coupled to a ground power supply pad 24 for the integrated circuit. The supply lines 14p and 16 could be internal nodes without pad connections. The functional circuit 28 to be protected is also coupled between the positive supply voltage line 14p and the ground supply voltage line 16.

The switching circuit 12p has a first conduction terminal 32p coupled to the positive supply voltage line 14p and a second conduction terminal 34p coupled to the ground supply voltage line 16. A control terminal 36p of the switching circuit 12p receives a trigger signal generated by a trigger circuit 40p that senses a transient voltage difference (e.g., a rise time detection) in the supply lines 14p and 16, respectively, and asserts the trigger signal in response to the sensed difference. In an embodiment, the switching circuit 12p comprises an n-channel MOSFET device with the first conduction terminal 32p being the drain terminal, the second conduction terminal 34p being the source terminal and the control terminal 36p being the gate terminal.

The trigger circuit 40p comprises an ESD detection circuit 42p and a trigger signal conditioning circuit 44p. The ESD detection circuit 42p is formed by a resistive-capacitive (RC) circuit comprising a resistor 50p connected in series with a capacitor 52p between the supply lines 14p and 16. A first terminal of the resistor 50p is connected to the supply line 16 and a second terminal of the resistor 50p is connected to node 56p. A first plate of the capacitor 52p is connected to node 56p and a second plate of the capacitor 52p is connected to the supply line 14p. The ESD detection circuit 42p further includes a diode 54p connected in parallel with the capacitor 52p with an anode terminal connected to the node 56p and a cathode terminal connected to the supply line 14p. An n-channel MOSFET device 58p configured as a capacitor is connected in parallel with the resistor 50p with the gate terminal connected to node 56p and the source and drain terminals both connected to supply line 16.

The trigger signal conditioning circuit 44p comprises first and second inverter circuits 60p and 62p, respectively, connected in series with each other. The inverter circuits 60p and 62p are powered from the supply lines 14p and 16, with an input of the inverter circuit 60p connected to node 56p, an output of inverter circuit 60p connected to an input of inverter circuit 62p and an output of inverter circuit 60p connected to the control terminal 36p of the switching circuit 12p.

A return diode 70p is connected between the supply lines 14p and 16 with the anode terminal of diode 70p connected to the supply line 16 and the cathode terminal of diode 70p connected to the supply line 14p.

In some implementations, the trigger signal conditioning circuit 44p may be omitted with node 56p directly connected to the gate terminal of the switching circuit 12p. In other implementations, the trigger signal conditioning may be made of a single stage inverter connected to a reversed RC detector. This reversed RC detector may be connected as follows, a first terminal of the resistor 50p may be connected to the supply line 14p and a second terminal of the resistor 50p may be connected to node 56p. A first plate of the capacitor 52p may be connected to node 56p and a second plate of the capacitor 52p may be connected to the supply line 16. The connection orientation of the diode 54n and transistor 58n are similarly reversed in this configuration. An output of the single stage inverter may be connected to the gate terminal 36p of the switching circuit 12p, and an input of the single stage inverter may be connected to the node 56p.

FIG. 2 shows a circuit diagram for a conventional supply clamp circuit 10n for electrostatic discharge (ESD) protection with respect to a negative voltage supply range. The supply clamp circuit 10n is formed by a switching circuit 12n coupled between the ground supply voltage line 16 (GND) of the integrated circuit and a negative supply voltage line 14n (NEG_VDD) of the integrated circuit. The negative supply voltage line 14n is coupled to a negative power supply pad 22n for the integrated circuit and the ground supply voltage line 16 is coupled to a ground power supply pad 24 for the integrated circuit. The supply lines 14n and 16 could be internal nodes without pad connections. The functional circuit 28 to be protected is also coupled between the negative supply voltage line 14n and the ground supply voltage line 16.

The switching circuit 12n has a first conduction terminal 32n coupled to the ground supply voltage line 16 and a second conduction terminal 34n coupled to the negative supply voltage line 14n. A control terminal 36n of the switching circuit 12n receives a trigger signal generated by a trigger circuit 40n that senses a transient voltage difference (e.g., a rise time detection) in the supply lines 14n and 16, respectively, and asserts the trigger signal in response to the sensed difference. In an embodiment, the switching circuit 12n comprises an n-channel MOSFET device with the first conduction terminal 32n being the drain terminal, the second conduction terminal 34n being the source terminal and the control terminal 36n being the gate terminal.

The trigger circuit 40n comprises an ESD detection circuit 42n and a trigger signal conditioning circuit 44n. The ESD detection circuit 42n is formed by a resistive-capacitive (RC) circuit comprising a resistor 50n connected in series with a capacitor 52n between the supply lines 14n and 16. A first terminal of the resistor 50n is connected to the supply line 14n and a second terminal of the resistor 50n is connected to node 56p. A first plate of the capacitor 52n is connected to node 56n and a second plate of the capacitor 52n is connected to the supply line 16. The ESD detection circuit 42n further includes a diode 54n connected in parallel with the capacitor 52n with an anode terminal connected to the node 56n and a cathode terminal connected to the supply line 16. An n-channel MOSFET device 58n configured as a capacitor is connected in parallel with the resistor 50n with the gate terminal connected to node 56n and the source and drain terminals both connected to supply line 14n.

The trigger signal conditioning circuit 44n comprises first and second inverter circuits 60n and 62n, respectively, connected in series with each other. The inverter circuits 60n and 62n are powered from the supply lines 14n and 16, with an input of the inverter circuit 60n connected to node 56n, an output of inverter circuit 60n connected to an input of inverter circuit 62n and an output of inverter circuit 60n connected to the control terminal 36n of the switching circuit 12n.

A return diode 70n is connected between the supply lines 14n and 16 with the anode terminal of diode 70n connected to the supply line 14n and the cathode terminal of diode 70n connected to the supply line 16.

In some implementations, the trigger signal conditioning circuit 44n may be omitted with node 56n directly connected to the gate terminal of the switching circuit 12n. In other implementations, the trigger signal conditioning may be made of a single stage inverter connected to a reversed RC detector. This reversed RC detector may be connected as follows, a first terminal of the resistor 50n may be connected to the supply line 16 and a second terminal of the resistor 50n may be connected to node 56n. A first plate of the capacitor 52n may be connected to node 56n and a second plate of the capacitor 52p may be connected to the supply line 14n. The connection orientation of the diode 54n and transistor 58n are similarly reversed in this configuration. An output of the single stage inverter may be connected to the gate terminal 36n of the switching circuit 12n, and an input of the single stage inverter may be connected to the node 56n.

SUMMARY

In an embodiment, an electrostatic discharge (ESD) protection circuit comprises: a first power supply line; a second power supply line; a MOSFET switching circuit having a first conduction terminal connected to the first power supply line, a second conduction terminal connected to the second power supply line and a gate control terminal; a first trigger circuit configured to generate, in response to detection of a positive ESD event at one or more of the first and second power supply lines, a positive trigger signal; a second trigger circuit configured to generate, in response to detection of a negative ESD event at one or more of the first and second power supply lines, a negative trigger signal; and a pass circuit configured to pass the positive and negative trigger signals for application to the gate terminal of the MOSFET switching circuit.

In an embodiment, an electrostatic discharge (ESD) protection circuit comprises: a first power supply line; a second power supply line; a switching circuit having a first conduction terminal connected to the first power supply line, a second conduction terminal connected to the second power supply line and a switch control terminal; a first trigger circuit configured to generate, in response to detection of a positive ESD event at one or more of the first and second power supply lines, a positive trigger signal; and a second trigger circuit configured to generate, in response to detection of a negative ESD event at one or more of the first and second power supply lines, a negative trigger signal; wherein the switching circuit is actuated in response to each of the positive trigger signal and the negative trigger signal.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
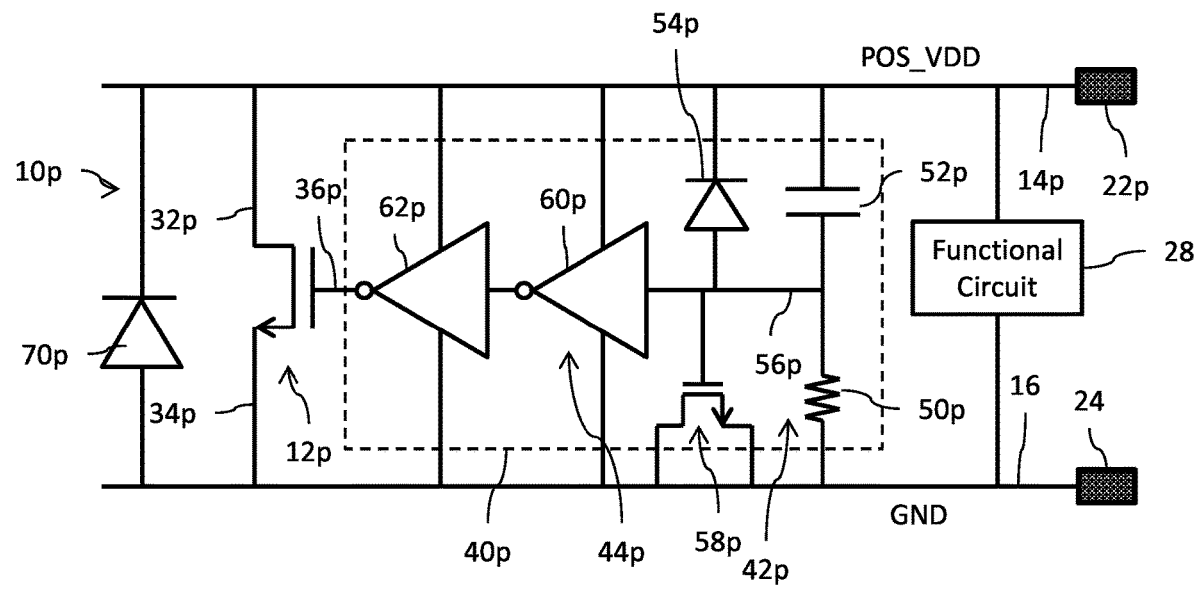
FIG. 1 shows a circuit diagram for a conventional supply clamp circuit for electrostatic discharge (ESD) protection with respect to a positive voltage supply range.
Figure 2:
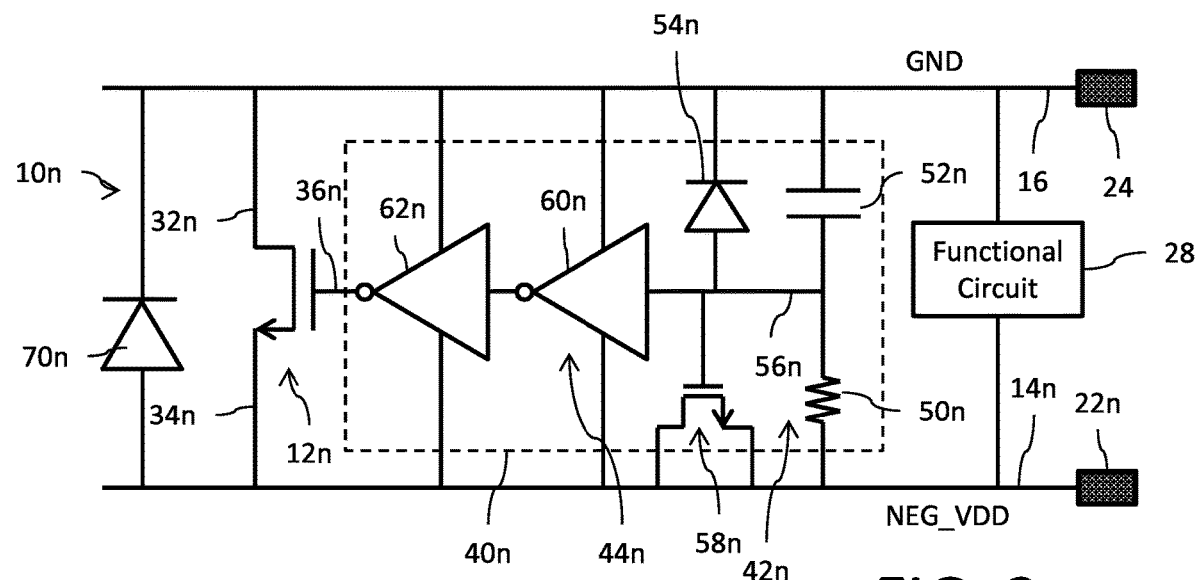
FIG. 2 shows a circuit diagram for a conventional supply clamp circuit for ESD protection with respect to a negative voltage supply range.
Figure 3:
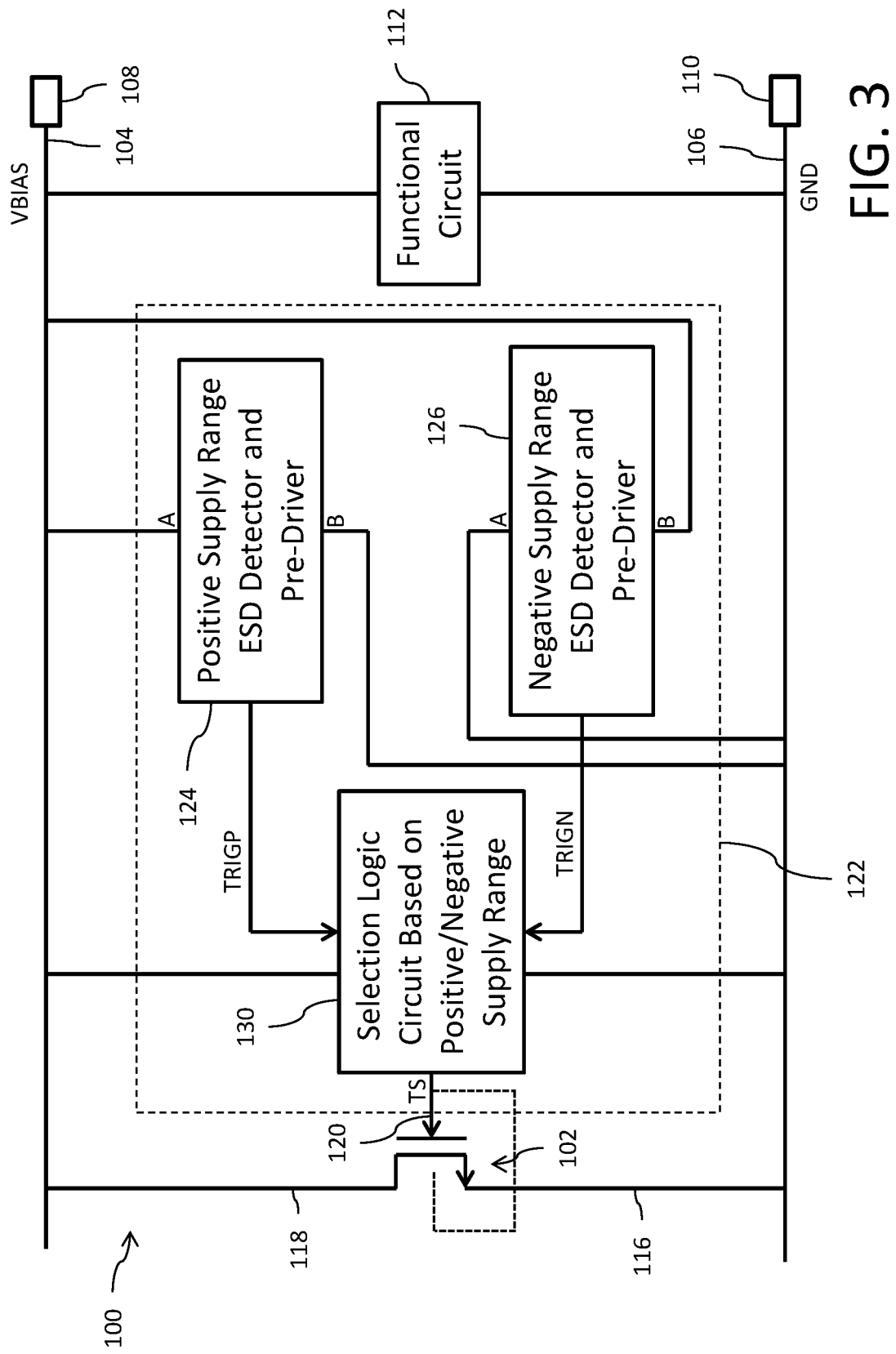
FIG. 3 shows a circuit diagram for a bi-directional supply clamp circuit for ESD protection.

Reference is now made to FIG. 3 which shows a circuit diagram for a bi-directional supply clamp circuit 100 for electrostatic discharge (ESD) protection. The supply clamp circuit 100 is formed by a switching circuit 102 coupled between a bias supply voltage line 104 (VBIAS) of the integrated circuit and a ground supply voltage line 106 (GND) of the integrated circuit. The voltage VBIAS on the bias supply voltage line 104 may be either a positive supply voltage POS_VDD or a negative supply voltage NEG_VDD depending on circuit implementation and operation. The bi-directional supply clamp circuit 100 is equally operable for providing ESD protection with respect to either positive or negative supply voltage on the bias supply voltage line 104. The bias supply voltage line 104 is coupled to a bias power supply pad 108 for the integrated circuit and the ground supply voltage line 106 is coupled to a ground power supply pad 110 for the integrated circuit. The supply lines 104 and 106 could be internal nodes without pad connections. The functional circuit 112 to be protected is also coupled between the supply line 104 and the supply line 106.

The switching circuit 102 has a first conduction terminal 116 coupled to the ground supply voltage line 106 and a second conduction terminal 118 coupled to the bias supply voltage line 104. A control terminal 120 of the switching circuit 102 receives a trigger signal TS generated by a trigger circuit 122 that senses a transient voltage difference (e.g., a rise time detection) in the supply lines 104 and 106, respectively, and asserts the trigger signal in response to the sensed difference. In an embodiment, the switching circuit 102 comprises an n-channel MOSFET device with the first conduction terminal 116 being the source terminal, the second conduction terminal 118 being the drain terminal and the control terminal 120 being the gate terminal. In a preferred implementation, the n-channel MOSFET device may have a symmetrical structure implemented on a fully depleted semiconductor on insulator (FDSOI) substrate. When actuated, the n-channel MOSFET device is capable of conducting current in either direction (i.e., the device is bidirectional). In an embodiment, as indicated by the dotted lines, the gate of the MOSFET device may be tied to a back gate provided through the SOI construction.

The trigger circuit 122 includes a positive supply range ESD detector and pre-driver circuit 124 and a negative supply range ESD detector and pre-driver circuit 126. The positive supply range ESD detector and pre-driver circuit 124 is coupled to the supply lines 104 and 106 and operates to sense a transient voltage difference (e.g., a rise time detection) in the supply lines 104 and 106, respectively, caused by a positive ESD stress event. In response thereto, the positive supply range ESD detector and pre-driver circuit 124 generates a positive trigger signal TRIGP. The negative supply range ESD detector and pre-driver circuit 126 is coupled to the supply lines 104 and 106 and operates to sense a transient voltage difference (e.g., a rise time detection) in the supply lines 104 and 106, respectively, caused by a negative ESD stress event. In response thereto, the negative supply range ESD detector and pre-driver circuit 126 generates a negative trigger signal TRIGN.

Figure 4:
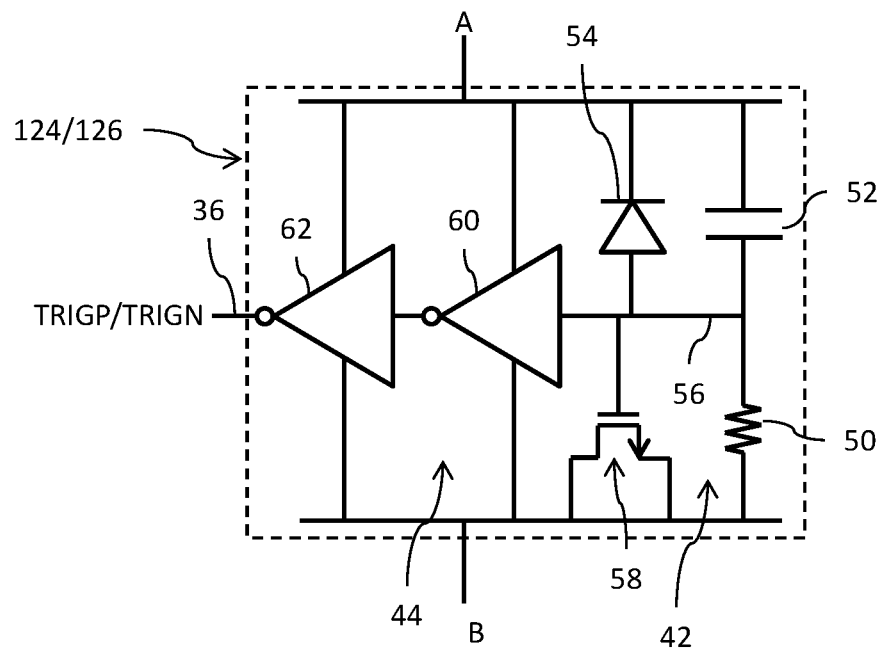
FIG. 4 is a circuit diagram for a positive/negative supply range ESD detector and pre-driver circuit used within the circuit of FIG. 3.

Reference is now made to FIG. 4 showing a circuit diagram for the positive supply range ESD detector and pre-driver circuit 124 and the negative supply range ESD detector and pre-driver circuit 126. The same circuit configuration may be used for each circuit 124 and 126. The difference between the circuit 124 and the circuit 126 is in the connection of the nodes A and B to the supply lines 104 and 106. More specifically, the circuit 124 is connected with an opposite polarity to the circuit 126 as will be explained herein.

The circuits 124/126 each comprise an ESD detection circuit 42 and a trigger signal conditioning circuit 44. The ESD detection circuit 42 is formed by a resistive-capacitive (RC) circuit comprising a resistor 50 connected in series with a capacitor 52 between node A and node B. A first terminal of the resistor 50 is connected to node B and a second terminal of the resistor 50 is connected to node 56. A first plate of the capacitor 52 is connected to node 56 and a second plate of the capacitor 52 is connected to node A. The ESD detection circuit 42 further includes a diode 54 connected in parallel with the capacitor 52 with an anode terminal connected to the node 56 and a cathode terminal connected to the node A. An n-channel MOSFET device 58 configured as a capacitor is connected in parallel with the resistor 50 with the gate terminal connected to node 56 and the source and drain terminals both connected to node B.

The trigger signal conditioning circuit 44 comprises first and second inverter circuits 60 and 62, respectively, connected in series with each other. The inverter circuits 60 and 62 are powered from nodes A and B, with an input of the inverter circuit 60 connected to node 56, an output of inverter circuit 60 connected to an input of inverter circuit 62 and an output 36 of inverter circuit 60 generating the trigger signal (TRIGP or TRIGN).

The positive supply range ESD detector and pre-driver circuit 124 has its node A connected to the supply line 104 and its node B connected to the supply line 106. With this first polarity connection, the positive supply range ESD detector and pre-driver circuit 124 will operate to detect a transient voltage difference (e.g., a rise time detection) in the supply lines 104 and 106, respectively, caused by a positive ESD stress event and generate the positive trigger signal TRIGP in response thereto. Conversely, the negative supply range ESD detector and pre-driver circuit 126 has its node B connected to the supply line 104 and its node A connected to the supply line 106. With this second polarity connection (opposite the first polarity connection), the negative supply range ESD detector and pre-driver circuit 126 will operate to detect a transient voltage difference (e.g., a rise time detection) in the supply lines 104 and 106, respectively, caused by a negative ESD stress event and generate the negative trigger signal TRIGN in response thereto.

With reference once again to FIG. 3, the trigger circuit 122 further includes a selection logic circuit 130 that operates to control passage of the positive trigger signal TRIGP and/or the negative trigger signal TRIGN to generate the trigger signal TS. The selection logic circuit 130 is coupled to the supply lines 104 and 106. In the case of a positive ESD stress event, the positive trigger signal TRIGP output from the positive supply range ESD detector and pre-driver circuit 124 is passed through the selection logic circuit 130 to produce the trigger signal TS. In the case of a negative ESD stress event, the negative trigger signal TRIGN output from the negative supply range ESD detector and pre-driver circuit 126 is passed through the selection logic circuit 130 to produce the trigger signal TS.

Figure 5:
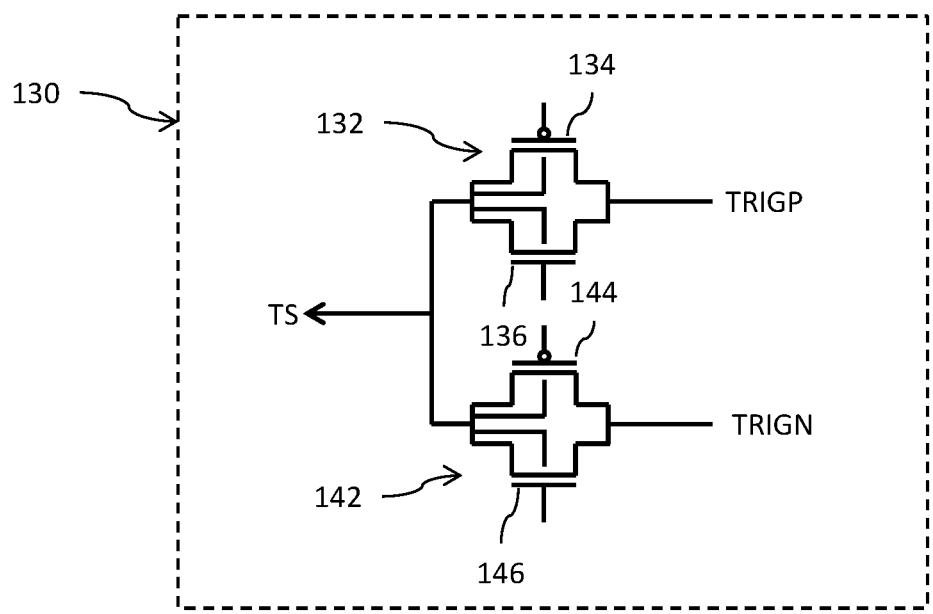
FIG. 5 is a circuit diagram for a selection logic circuit used within the circuit of FIG. 3.

Reference is now made to FIG. 5 showing a circuit diagram for the selection logic circuit 130. The selection logic circuit 130 includes a first CMOS pass gate 132 formed by a p-channel MOSFET device 134 and n-channel MOSFET device 136 source-drain connected in parallel with each other. In particular, the drain terminals of the devices 134 and 136 are connected to receive the positive trigger signal TRIGP output from the positive supply range ESD detector and pre-driver circuit 124 and the source terminals of the devices 134 and 136 are connected to the gate of the switching circuit 102. The sources of the devices 134 and 136 are connected to the transistor body. The gate terminals of the devices 134 and 136 are connected to receive appropriate biasing voltages to operate as pass gates. The selection logic circuit 130 further includes a second CMOS pass gate 142 formed by a p-channel MOSFET device 144 and n-channel MOSFET device 146 source-drain connected in parallel with each other. In particular, the drain terminals of the devices 144 and 146 are connected to receive the negative trigger signal TRIGN output from the negative supply range ESD detector and pre-driver circuit 126 and the source terminals of the devices 144 and 146 are connected to the gate of the switching circuit 102. The sources of the devices 144 and 146 are connected to the transistor body. The gate terminals of the devices 144 and 146 connected to receive appropriate biasing voltages to operate as pass gates.

Figure 6A:
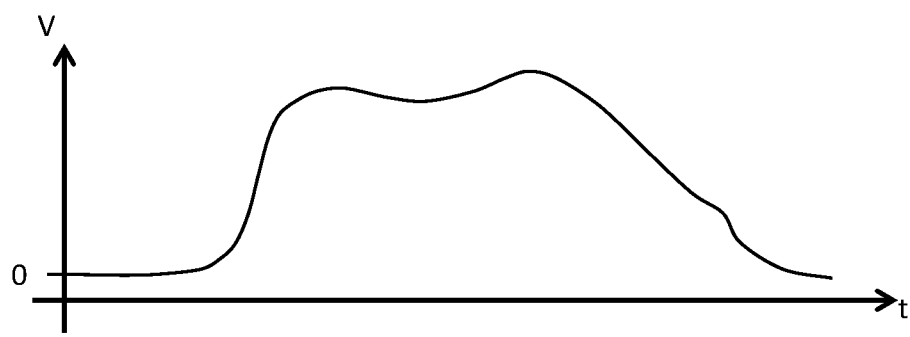
FIGS. 6A-6C show waveforms illustrating operation of the FIG. 3 circuit for a positive ESD stress event.
Figure 6B:
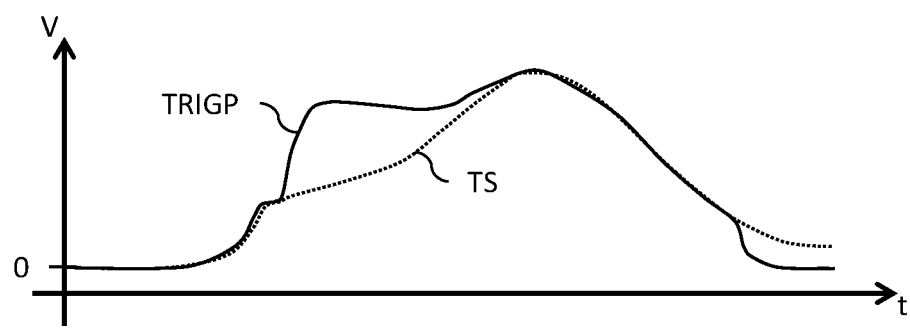
Figure 6C:
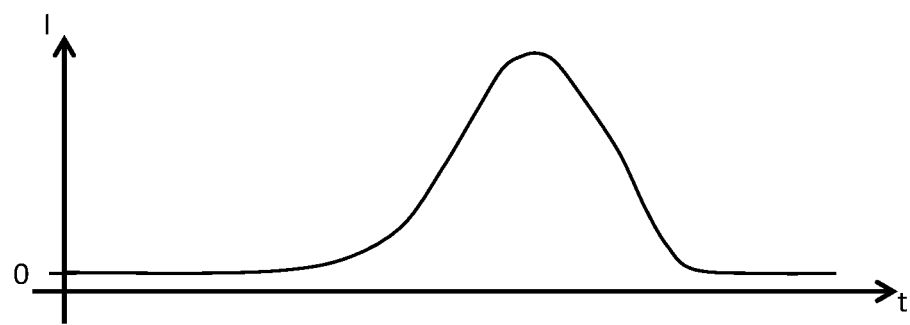

Reference is now made to FIGS. 6A-6C which show waveforms illustrating operation of the FIG. 3 circuit for a positive ESD stress event. FIG. 6A shows the ESD voltage for the positive ESD stress event. FIG. 6B shows the voltage for the positive trigger signal TRIGP output from the positive supply range ESD detector and pre-driver circuit 124 in response to detection of that FIG. 6A ESD event. FIG. 6B further shows the voltage for the trigger signal TS generated by the selection logic circuit 130 in response to the positive trigger signal TRIGP. FIG. 6C shows the current passing through the switching circuit 102 in response to actuation by the trigger signal TS.

Figure 7A:
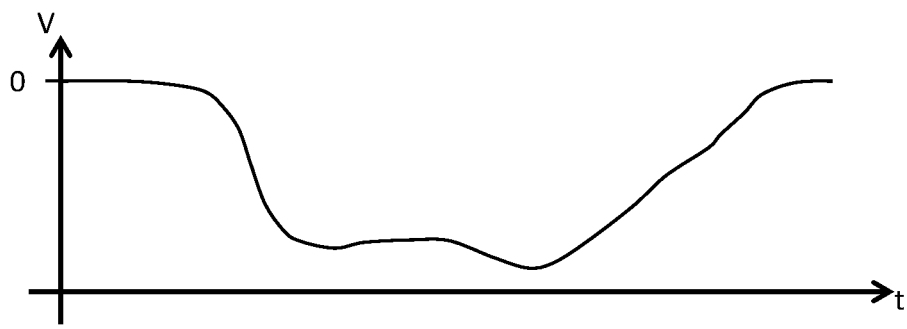
FIGS. 7A-7C show waveforms illustrating operation of the FIG. 3 circuit for a negative ESD stress event.
Figure 7B:
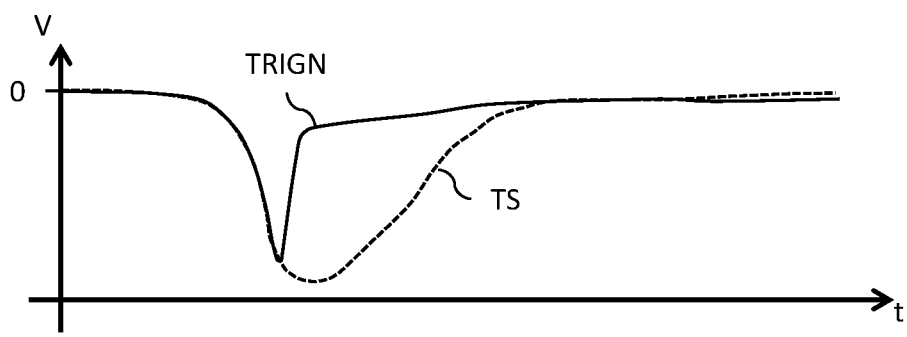
Figure 7C:
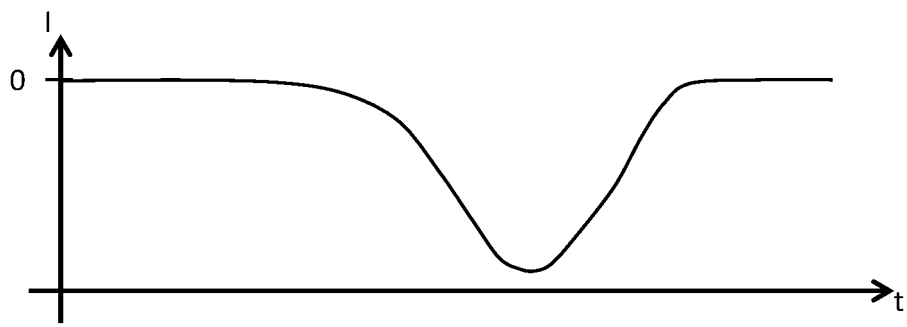

Reference is now made to FIGS. 7A-7C which show waveforms illustrating operation of the FIG. 3 circuit for a negative ESD stress event. FIG. 7A shows the ESD voltage for the negative ESD stress event. FIG. 7B shows the voltage for the negative trigger signal TRIGN output from the positive supply range ESD detector and pre-driver circuit 126 in response to detection of that FIG. 7A ESD event. FIG. 7B further shows the voltage for the trigger signal TS generated by the selection logic circuit 130 in response to the negative trigger signal TRIGN. FIG. 7C shows the current passing through the switching circuit 102 in response to actuation by the trigger signal TS.

The operation of the circuit 100 as shown in FIGS. 6A-6c and 7A-7B relates to human body model (HBM) at a 3 KV worst case.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An electrostatic discharge (ESD) protection circuit, comprising:
    a first power supply line;
    a second power supply line;
    a MOSFET switching circuit having a first conduction terminal connected to the first power supply line, a second conduction terminal connected to the second power supply line and a gate control terminal; and
    a trigger circuit, comprising:
        a first ESD detection circuit configured to generate, in response to detection of a positive ESD event at one or more of the first and second power supply lines, a positive trigger signal;
        a second ESD detection circuit configured to generate, in response to detection of a negative ESD event at one or more of the first and second power supply lines, a negative trigger signal; and
        a pass circuit configured to pass the positive and negative trigger signals for application to the gate terminal of the MOSFET switching circuit, wherein said pass circuit comprises:
            a first pass circuit comprising a first n-channel MOSFET and a first p-channel MOSFET connected to each other in parallel with drain terminals connected to receive the positive trigger signal and source terminals connected to generate a trigger control signal for application to the gate terminal of the MOSFET switching circuit; and
            a second pass circuit comprising a second n-channel MOSFET and a second p-channel MOSFET connected to each other in parallel with drain terminals connected to receive the negative trigger signal and source terminals connected to generate the trigger control signal for application to the gate terminal of the MOSFET switching circuit.

2. The ESD protection circuit of claim 1, further comprising a functional circuit electrically coupled for power supply to the first and second power supply lines.

3. The ESD protection circuit of claim 1, wherein the first conduction terminal of the MOSFET switching circuit is a drain terminal connected to the first power supply line and the second conduction terminal of the MOSFET switching circuit is a source terminal connected to the second power supply line.

4. The ESD protection circuit of claim 1, wherein the first ESD detection circuit comprises a first resistive-capacitive ESD detection circuit coupled between the first and second power supply lines and wherein the second ESD detection circuit comprises a second resistive-capacitive ESD detection circuit coupled between the first and second power supply lines.

5. The ESD protection circuit of claim 4,
    wherein the first resistive-capacitive ESD detection circuit comprises a first resistor having a first terminal connected to the second power supply line, a first capacitor having a first terminal connected to the first power supply line and second terminals of the first resistor and first capacitor connected to each other at a first intermediate node; and
    wherein the second resistive-capacitive ESD detection circuit comprises a second resistor having a first terminal connected to the first power supply line, a second capacitor having a first terminal connected to the second power supply line and second terminals of the second resistor and second capacitor connected to each other at a second intermediate node.

6. The ESD protection circuit of claim 5, further comprising:
    a first pre-driver circuit having an input coupled to the first intermediate node and an output generating the positive trigger signal; and
    a second pre-driver circuit having an input coupled to the second intermediate node and an output generating the negative trigger signal.

7. The ESD protection circuit of claim 1, wherein each of the first and second ESD detection circuits comprises:
    a resistive-capacitive ESD detection circuit;
    a first inverter circuit having an input coupled to an output of the resistive-capacitive ESD detection circuit; and
    a second inverter circuit having an input coupled to an output of the first inverter circuit and an output configured to generate the corresponding positive or negative trigger signal.

8. The ESD protection circuit of claim 7, wherein the resistive-capacitive ESD detection circuit of the first ESD detection circuit is coupled to the first and second power supply lines with a first polarity and the second ESD detection circuit is coupled to the first and second power supply lines with a second polarity, and wherein the first and second polarities are opposite.

9. An electrostatic discharge (ESD) protection circuit, comprising:
    a first power supply line;
    a second power supply line;
    a switching circuit having a first conduction terminal connected to the first power supply line, a second conduction terminal connected to the second power supply line and a switch control terminal; and
    a trigger circuit, comprising:
        a first ESD detection circuit configured to generate, in response to detection of a positive ESD event at one or more of the first and second power supply lines, a positive trigger signal; and
        a second ESD detection circuit configured to generate, in response to detection of a negative ESD event at one or more of the first and second power supply lines, a negative trigger signal;
    a first transistor that is gate biased to operate as a pass transistor for passing the positive trigger signal from the first ESD detection circuit to the switch control terminal of the switching circuit; and
    a second transistor that is gate biased to operate as a pass transistor for passing the negative trigger signal from the second ESD detection circuit to the switch control terminal of the switching circuit;
    wherein the switching circuit is actuated in response to each of the positive trigger signal and the negative trigger signal.

10. The ESD protection circuit of claim 9, further comprising a functional circuit electrically coupled for power supply to the first and second power supply lines.

11. The ESD protection circuit of claim 9, wherein the first conduction terminal of the switching circuit is a MOSFET drain terminal connected to the first power supply line and the second conduction terminal of the switching circuit is a MOSFET source terminal connected to the second power supply line.

12. The ESD protection circuit of claim 9, wherein the first ESD detection circuit comprises a first resistive-capacitive ESD detection circuit coupled between the first and second power supply lines and wherein the second ESD detection circuit comprises a second resistive-capacitive ESD detection circuit coupled between the first and second power supply lines.

13. The ESD protection circuit of claim 12,
wherein the first resistive-capacitive ESD detection circuit comprises a first resistor having a first terminal connected to the second power supply line, a first capacitor having a first terminal connected to the first power supply line and second terminals of the first resistor and first capacitor connected to each other at a first intermediate node; and
wherein the second resistive-capacitive ESD detection circuit comprises a second resistor having a first terminal connected to the first power supply line, a second capacitor having a first terminal connected to the second power supply line and second terminals of the second resistor and second capacitor connected to each other at a second intermediate node.

14. The ESD protection circuit of claim 13, further comprising:
a first pre-driver circuit having an input coupled to the first intermediate node and an output generating the positive trigger signal; and
a second pre-driver circuit having an input coupled to the second intermediate node and an output generating the negative trigger signal.

15. The ESD protection circuit of claim 9, wherein each of the first and second ESD detection circuits comprises:
a resistive-capacitive ESD detection circuit;
a first inverter circuit having an input coupled to an output of the resistive-capacitive ESD detection circuit; and
a second inverter circuit having an input coupled to an output of the first inverter circuit and an output configured to generate the corresponding positive or negative trigger signal.

16. The ESD protection circuit of claim 15, wherein the resistive-capacitive ESD detection circuit of the first ESD detection circuit is coupled to the first and second power supply lines with a first polarity and the second ESD detection circuit is coupled to the first and second power supply lines with a second polarity, and wherein the first and second polarities are opposite.

* * * * *